United States Patent
Guo et al.

(10) Patent No.: US 9,377,539 B2
(45) Date of Patent: Jun. 28, 2016

(54) X-RAY DETECTION BOARD AND MANUFACTURE METHOD THEREOF, AND X-RAY DETECTION DEVICE

(71) Applicant: BOE TECHNOLOGY GROUP CO., LTD., Beijing (CN)

(72) Inventors: Wei Guo, Beijing (CN); Qianqian Bu, Beijing (CN); Qingrong Ren, Beijing (CN); Zhao Kang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/518,341

(22) Filed: Oct. 20, 2014

(65) Prior Publication Data
US 2015/0378032 A1   Dec. 31, 2015

(30) Foreign Application Priority Data
Jun. 25, 2014   (CN) .......................... 2014 1 0291013

(51) Int. Cl.
*G01T 1/20*   (2006.01)
*H01L 31/18*   (2006.01)
(52) U.S. Cl.
CPC ............ *G01T 1/2002* (2013.01); *G01T 1/2018* (2013.01); *H01L 31/1804* (2013.01)
(58) Field of Classification Search
CPC ........... G01T 3/06; G01T 1/1644; G01T 1/20; G01N 23/04
See application file for complete search history.

(56) References Cited

U.S. PATENT DOCUMENTS

| | | | |
|---|---|---|---|
| 5,101,253 A | 3/1992 | Mizutani et al. | |
| 5,812,629 A * | 9/1998 | Clauser | A61B 6/032 378/37 |
| 7,435,966 B2 | 10/2008 | Vogtmeier et al. | |
| 8,497,481 B2 | 7/2013 | Shinba et al. | |
| 2002/0027239 A1 | 3/2002 | Ohkubo | |
| 2013/0322598 A1* | 12/2013 | Saruta | G10T 1/2006 378/62 |

FOREIGN PATENT DOCUMENTS

| | | |
|---|---|---|
| CN | 1742212 A | 3/2006 |
| CN | 102667525 A | 9/2012 |
| JP | 2000-236079 A | 8/2000 |

OTHER PUBLICATIONS

First Office Action, including Search Report, for Chinese Patent Application No. 201410291013.9, dated Feb. 2, 2016, 14 pages.

* cited by examiner

Primary Examiner — David Porta
Assistant Examiner — Faye Boosalis
(74) Attorney, Agent, or Firm — Westman, Champlin & Koehler, P.A.

(57) ABSTRACT

An X-ray detection board and a manufacture method thereof, and an X-ray detection device are disclosed in the embodiments of the present invention. The X-ray detection board comprises: a substrate; photoelectric conversion devices disposed on the substrate; a conversion layer disposed on the photoelectric conversion devices and configured to convert X-rays into visible light; and a packaging layer disposed on the conversion layer and having a plurality of transmission windows, wherein the photoelectric conversion devices correspond in position to the transmission windows, respectively, and wherein condenser lenses for condensing the light converted by the conversion layer are disposed on sides of the photoelectric conversion devices facing the transmission windows. A light condensing effect is improved by use of the condenser lenses such as microlenses so that more light can be projected upon the photoelectric conversion devices through the condenser lenses. As a result, a quantum efficiency and thus an imaging effect are improved.

13 Claims, 2 Drawing Sheets

X-RAY DETECTION BOARD AND MANUFACTURE METHOD THEREOF, AND X-RAY DETECTION DEVICE

CROSS-REFERENCE TO RELATED APPLICATION

This application claims the benefit of Chinese Patent Application No. 201410291013.9 filed on Jun. 25, 2014 in the State Intellectual Property Office of China, the whole disclosure of which is incorporated herein by reference.

BACKGROUND OF THE INVENTION

1. Field of the Invention

The disclosure relates to a technical field of an X-ray detection device, and particularly to an X-ray detection board and a manufacturing method thereof, and an X-ray detection device.

2. Description of the Related Art

An indirect conversion type detector comprises an X-ray conversion layer, an amorphous silicon photodiode, a thin film transistor (TFT), a signal amplifier, a signal reader, and the like. An indirect flat panel detector mainly comprises a scintillator (caesium iodide) or fluorophor (gadolinium oxysulfide) layer, an amorphous silicon layer serving as a photodiode, and a TFT array.

An optical window of the indirect conversion type detector comprises an anti-scatter grid and a scintillator (caesium iodide) or fluorophor(gadolinium oxysulfide). The conventional optical window has a poor performance, which directly and adversely affects photoelectric conversion efficiency, thereby resulting in a poor imaging effect.

SUMMARY OF THE INVENTION

An object of embodiments of the present invention is to provide an X-ray detection board and a manufacture method thereof, and an X-ray detection device, which can improve a quantum efficiency, reduce an X-ray dose, and further improve an imaging effect.

According to embodiments of the present invention, there is provided an X-ray detection board, comprising:
a substrate;
photoelectric conversion devices disposed on the substrate;
a conversion layer disposed on the photoelectric conversion devices and configured to convert X-rays into visible light; and
a packaging layer disposed on the conversion layer and having a plurality of transmission windows, wherein the photoelectric conversion devices correspond in position to the transmission windows, respectively, and wherein condenser lenses for condensing the light converted by the conversion layer are disposed on a side of the photoelectric conversion devices facing the transmission windows.

According to embodiments of the present invention, there is provided a manufacture method of the abovementioned X-ray detection board, comprising:
forming the condenser lenses over the formed photoelectric conversion devices, respectively;
forming the conversion layer over the formed condenser lenses; and
forming the packaging layer over the formed conversion layer, and forming the plurality of transmission windows in the formed packaging layer, wherein the photoelectric conversion devices correspond to the transmission windows, respectively.

According to embodiments of the present invention, there is provided an X-ray detection device comprising the abovementioned X-ray detection board.

Figure 1:
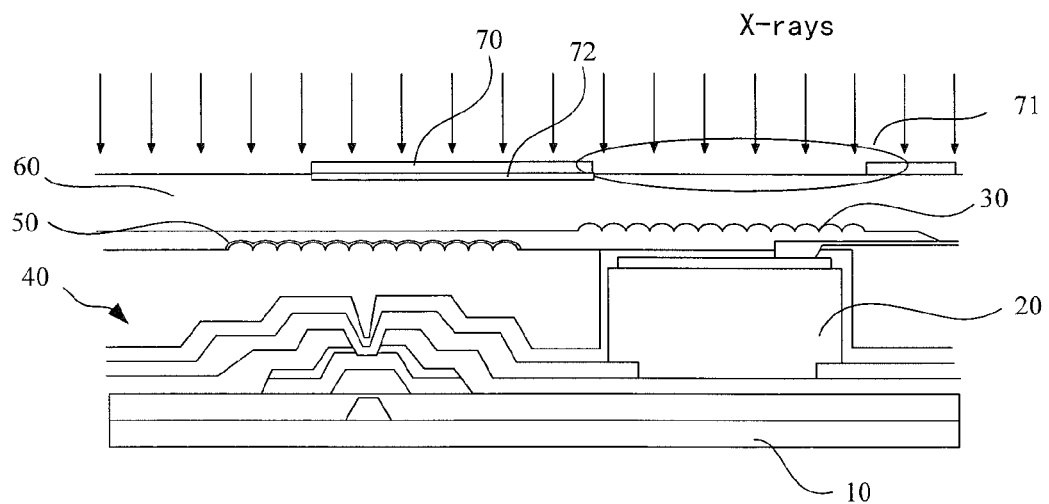
FIG. 1 is a schematic diagram showing a structure of an X-ray detection board according to an embodiment of the present invention.

The reference numerals in the drawings are listed as follows:

10: substrate; 20: photodiode; 30: condenser lens;
40: thin film transistor; 50: first reflection layer; 51: arc-shaped protrusion;
52: reflection film or reflection surface; 60: conversion layer: 70: packaging layer;
71: transmission window; and, 72: second reflection layer.

DETAILED DESCRIPTION OF THE EMBODIMENTS

A further description of the invention will be made in detail as below with reference to embodiments of the present invention taken in conjunction with the accompanying drawings. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

According to an general concept of the present invention, there is provided an X-ray detection board, comprising: a substrate; photoelectric conversion devices disposed on the substrate; a conversion layer disposed on the photoelectric conversion devices and configured to convert X-rays into visible light; and a packaging layer disposed on the conversion layer and having a plurality of transmission windows, wherein the photoelectric conversion devices correspond in position to the transmission windows, respectively, and wherein condenser lenses for condensing the light converted by the conversion layer are disposed on sides of the photoelectric conversion devices facing the transmission windows.

With the above technical solution, when X-rays irradiate the detection board, they irradiate the conversion layer through the transmission windows of the packaging layer and are converted into visible light by the conversion layer, and then the visible light are projected on the photoelectric conversion devices through the condenser lenses and are finally converted into electrical signals A light condensing effect is improved by use of the condenser lenses such as microlenses so that more light can be projected on the photoelectric conversion devices through the condenser lenses. As a result, a quantum efficiency and an imaging effect are improved.

According to an general concept of the present invention, there is provided a manufacturing method of the abovementioned X-ray detection board, comprising: forming the condenser lenses over the formed photoelectric conversion devices, respectively; forming the conversion layer over the formed condenser lenses; and forming the packaging layer over the formed conversion layer, and forming the plurality of transmission windows in the formed packaging layer, wherein the photoelectric conversion devices correspond in position to the transmission windows, respectively.

With the X-ray detection board manufactured by the above method, more light can be projected on the photoelectric conversion devices through the condenser lenses. As a result, a quantum efficiency and an imaging effect are improved.

According to a general concept of the present invention, there is provided an X-ray detection device comprising the abovementioned X-ray detection board.

With the above technical solution, when X-rays irradiate the detection board, they irradiate the conversion layer through the transmission windows of the packaging layer and are converted into visible light by the conversion layer, and then the visible light are projected on the photoelectric conversion devices through the condenser lenses and are finally converted into electrical signals. A light condensing effect is improved by use of the condenser lenses such as microlenses so that more light can be projected on the photoelectric conversion devices through the condenser lenses. As a result, a quantum efficiency and thus an imaging effect are improved.

A further description of the invention will be made in detail as below with reference to embodiments of the present invention taken in conjunction with the accompanying drawings. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram showing a structure of an X-ray detection board according to an embodiment of the present invention.

According to embodiments of the present invention, there is provided an X-ray detection board. The X-ray detection board comprises: a substrate 10; photodiodes 20 disposed on the substrate 10; a conversion layer 60 disposed on the photodiodes 20 and configured to convert X-rays into visible light; and a packaging layer 70 disposed on the conversion layer 60 and having a plurality of transmission windows 71. The photodiodes 20 correspond in position to the transmission windows 71, respectively, and condenser lenses 30 for condensing light converted by the conversion layer 60 are disposed on sides of the photodiodes 20 facing the transmission windows 71.

In the above embodiment, as illustrated in FIG. 1, when X-rays irradiate the detection board, they irradiate the conversion layer through the transmission windows 71 of the packaging layer 70 and are converted into visible light by the conversion layer 60, and then the visible light are projected on the photodiodes 20 through the condenser lenses 30 and are finally converted into electrical signals. A light condensing effect is improved through the condenser lenses such as microlenses so that more light can be projected on the photodiodes 20 through the condenser lenses 30. As a result, a quantum efficiency is improved. It can be known from an imaging principle that detective quantum efficiency (DQE) reflects sensitivity, noise, X-ray dose, and density resolution of a flat panel type detector. The academic and radiological community has arrived at a consensus that the DQE is an optimal parameter for reflecting an imaging performance of an X-ray imaging detector. The DQE represents an ability of an imaging device to retain a signal-to-noise ratio of a signal source when radiation is converted into a digital imaging. The DQE value can also represent an efficiency at which a digital X-ray imaging device utilizes a radiation dose. The value of the DQE is given by the following formula:

$$DQE = \frac{(S/N)_{out}^2}{(S/N)_{in}^2} = Const \cdot \frac{[S \cdot MTF(f)]^2}{NPS(f) \cdot \phi}$$

where S represents a signal, N represents a noise, MTF(f) represents a spatial modulation transfer function of a detector system, NPS(f) represents a noise power frequency spectrum, and Φ represents a quantum number of incident X-rays.

It can be known from the above description that a quantum number of incident X-rays can be increased by increasing a rate of incidence of light, thereby improving the imaging effect.

As illustrated in FIG. 1, the X-ray detection board further comprises thin film transistors 40 disposed on the substrate 10. The thin film transistors 40 and the photodiodes 20 are arranged side by side and coupled to one another.

The conversion layer 60 may be made of any material that is able to convert the X-rays into visible light. Specifically, the conversion layer 60 may comprise a scintillator layer or a fluorophor layer. The scintillator layer and the fluorophor layer can effectively convert the X-rays into visible light.

Figure 2:
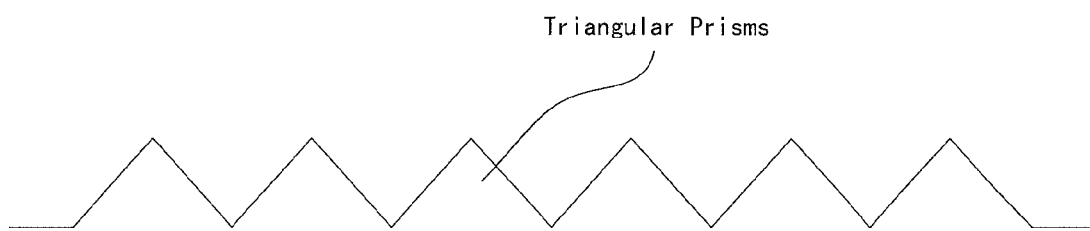
FIG. 2 is a schematic diagram showing a structure of a condenser lens according to another embodiment of the present invention.

In the above embodiments, the condenser lenses 30 can condense more visible light onto the photodiodes 20 so that more light is converted into electrical signals. As a result, the quantum number of the incident X-rays is increased, thereby the imaging effect is improved. In some embodiments, the condenser lens 30 may have various structures. Referring to both FIGS. 1 and 2, the condenser lens in the form of triangular prisms is shown in FIG. 2. In some embodiments, the condenser lenses 30 comprise a plurality of convex lenses or triangular prisms arranged in an array manner. Both the convex lenses and the triangular prisms have a light condensing effect so that they can condense more light onto the photodiodes 20. In some embodiments, a flat layer is formed on the light emitting diodes, and protrusions in the shape of a triangular pyramid or an arc are formed on the flat layer to form structures of the triangular prisms or the convex lenses.

Furthermore, in some embodiments, in order to further increase the quantum number of the incident X-rays so as to improve the imaging effect, in addition to the condenser lenses 30, the X-ray detection board according to the embodiment may further comprise first reflection layers 50 disposed between the conversion layer 60 and the thin film transistors 40 and configured to reflect light that otherwise would be irradiated onto the thin film transistors 40. The packaging layer 70 is provided with second reflection layers 72 configured to cooperate with the first reflection layers 50. With the above structure, the visible light converted by the conversion layer 60 is reflected by the first reflection layers 50 onto the second reflection layer 72, and is further reflected by the second reflection layers 72 so that a part of the light can be irradiated onto the condenser lenses 30 and irradiated through the condenser lenses 30 onto the photodiodes 20. As a result, the quantum number of the incident X-rays is increased, thereby the imaging effect is effectively improved.

In some embodiments, other photoelectric conversion devices such as an amorphous silicon layer may be adopted instead of the photodiodes 20.

In the above embodiment, the first reflection layer 50 and the second reflection layer 72 may be positioned in different manners. For example, a projection of the second reflection layer 72 on a plane in which the first reflection layer 50 is located, in a direction perpendicular to the first reflection layer 50 and the first reflection layer 50 may be in different states such as a completely unsuperposed state, a partially superposed state, and a completely superposed state. In other words, in a vertical direction, the second reflection layer and the first reflection layer 50 may be positioned in the completely unsuperposed state, the partially superposed state, or the completely superposed state. When the first reflection layer 50 and the second reflection layer 72 are completely superposed in the vertical direction, the packaging layer 70 is made of a material that can transmit the X-rays, so that the X-rays are converted into the visible light by the conversion layer 60, and the visible light is irradiated onto the first reflection layer 50. It can be known from a simply structural principle that when the first reflection layer 50 and the second reflection layer 72 are partially superposed with each other in the vertical direction, the first reflection layer 50 can reflect more light onto the second reflection layer 72, and the light can be irradiated onto the condenser lens 30 by being reflected many times by the first reflection layer 50 and the second reflection layer 72. Therefore, it is preferred that the projection of the second reflection layer 72 on the plane in which the first reflection layer 50 is located, in the direction perpendicular to the first reflection layer 50 may be partially superposed with the first reflection layer 50.

Figure 3:
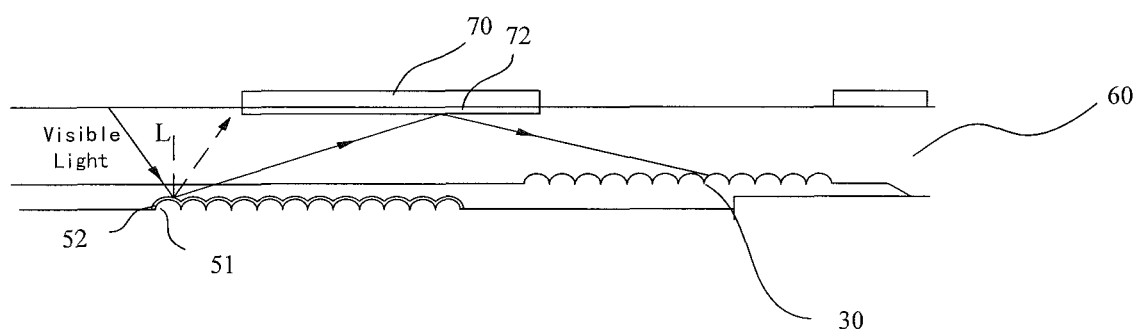
FIG. 3 is a schematic diagram showing an operational principle for a first reflection layer and a second reflection layer according to an embodiment of the present invention.

As illustrated in FIG. 3, in addition to the positions of the first reflection layers 50 and the second reflection layers 42 which enable more light to be irradiated onto the condenser lenses 30, an amount of light incident upon the condenser lens 30 is increased by varying the configuration of the first reflection layer 50. For example, the first reflection layer 50 comprises a plurality of arc-shaped protrusions 51 and a reflection film 52 disposed on the arc-shaped protrusions 51, or the first reflection layer 50 comprises a plurality of arc-shaped protrusions 51 which form a reflection surface 52 without needing the reflection film. In the above configuration, the reflection film 52 adhering to the arc-shaped protrusions 51, or the reflection surface 52 is formed in an arc-shaped reflection structure by forming the plurality of arc-shaped protrusions 51, and light incident upon the reflection film 52 or the reflection surface 52 is diffuse-reflected by the reflection film 52 or the reflection surface 52 so that more light can be irradiated onto the second reflection surface 72 by virtue of reflection. An effect of the reflection film 52 or the reflection surface 52 is illustrated in FIG. 3. FIG. 3 shows a situation where reflection of the light irradiated onto the reflection film 52 or the reflection surface 52 occurs. In FIG. 3, L denotes a normal of an imaginary reflection plane of the visible light, and a dashed line denotes a direction of propagation of the light reflected by the imaginary reflection plane. As can be seen from FIG. 3, the light cannot be irradiated onto the second reflection surface 72 if the reflection plane is adopted to reflect the light, but can be irradiated onto the second reflection surface 72 if the light is diffuse-reflected by the reflection film 52 or the reflection surface 52. In this way, the light can be irradiated onto the condenser lens 30 after being reflected many times.

According to embodiments of the present invention, there is provided a manufacture method of the abovementioned X-ray detection board, and the method comprises:

forming the condenser lenses 30 over the formed photodiodes 20, respectively;

forming the conversion layer over the formed condenser lenses 30; and forming the packaging layer 70 over the formed conversion layer, and forming the plurality of transmission windows 71 in the formed packaging layer 70, wherein the photodiodes 20 correspond in position to the transmission windows 71, respectively.

It can be known from the above description that the X-ray detection board manufactured by the above manufacture method has a light condensing function. More light can be condensed onto the photodiodes 20 by the condenser lenses 30. In this way, the rate of incidence of the light is increased. As a result, the quantum number of the incident X-rays can be increased, thereby the imaging effect is improved.

In some embodiments, the manufacture method further comprises: forming first reflection layers 50 on the thin film transistors 40 before forming the condenser lenses 30 on the formed photodiodes 20, the first reflection layers 50 being configured to reflect light that otherwise would be irradiated onto the thin film transistors 40; and forming on the packaging layer 70 second reflection layers 72 configured to cooperate with the first reflection layers 50 when forming the packaging layer 70.

With the above method, the first reflection layers 50 and the second reflection layers 72 are disposed in the X-ray detection board. More light can be irradiated onto the condenser lenses 30 by being reflected many times by the first reflection layers 50 and the second reflection layers 72. In this way, the rate of incidence of the light is increased. As a result, the quantum number of the incident X-rays can be increased, thereby the imaging effect is improved.

In some embodiments, other photoelectric conversion devices such as an amorphous silicon layer may be adopted instead of the photodiodes 20.

The manufacture method will be described in a specific embodiment as follows.

In step 1, a metal (aluminum-neodymium or molybdenum) for electrodes is deposited, a mask for a pattern of gates is exposed, developed and then dried, the pattern of the gates is etched, and the mask is peeled off.

In step 2, a gate insulation layer (silicon nitride) is deposited, an active layer and an ohmic contact layer (amorphous silicon and N+ amorphous silicon) are deposited, a pattern mask is exposed, developed and then dried, the gate insulation layer is dry-etched, and the mask is peeled off.

The gate insulation layer is made of silicon nitride (SiNx), silicon oxide (SiOx), or silicon oxynitride (SiONx), the active layer is made of amorphous silicon (a-Si) or an oxide such as IGZO, ITZO, or ZnONx, etc., and the ohmic contact layer is made of N+ amorphous silicon (N+ a-Si).

In step 3, a metal for source and drain electrodes is deposited, a mask for a pattern of the source and drain electrodes is exposed, developed and then dried, the source and drain electrodes are etched, the ohmic contact layer is etched, the mask is peeled off to form the source and drain electrodes. The source and drain electrodes are made of: Mo, AlNd, Cu, MoNb, Ti, Al, or the like.

In step 4, a PVX1 layer is deposited, a pattern mask for electrode contacting via holes is exposed, developed and then dried, the electrode contacting via holes are etched, and the mask is peeled off. The PVX1 layer is made of SixOyNz, SiNx, or SiOx.

In step 5, a photodiode 20 PIN layer is deposited.

In step 6, transparent electrodes are deposited on the photodiode 20 layer. The transparent electrodes are made of tin indium oxide (ITO).

In step 7, a pattern mask for the tin indium oxide layer is exposed, developed and then dried, the tin indium oxide layer is etched, and the mask is peeled off.

In step 8, a pattern mask for the photodiode 20 PIN layer is exposed, developed and then dried, the PIN layer is etched, and the mask is peeled off.

In step 9, a PVX2 layer is deposited, a pattern mask for a second layer of silicon oxynitride is exposed, developed and then dried, the second layer of silicon oxynitride is etched, and the mask is peeled off. The PVX2 layer is made of SixOyNz, SiNx, or SiOx.

In step 10, a first resin layer is formed on the deposited PVX2 layer, and protrusions of a reflection layer are fabricated when the first resin layer is formed.

Specifically, a mask is formed by applying a photoresist on the resin layer, and the pattern mask for the resin layer is exposed, developed and then dried.

In step 11, a pattern mask for electrode contacting via holes is formed on the first resin layer, the mask is exposed, developed and then dried, the electrode contacting via holes are etched, and the mask is peeled off.

In step 12, a metal reflection layer is fabricated on the protrusions of the reflection layer.

In step 13, a second resin layer is fabricated on the first resin layer, and condenser lenses 30 are fabricated on the second resin layer.

In step 14, a conversion layer 60 is fabricated on the second resin layer. The conversion layer 60 may comprise a scintillator layer or a fluorophor layer.

In step 15, the packaging layer 70 is fabricated on the conversion layer 60, and second reflection layers 72 are disposed on the formed packaging layer 70 and a plurality of transmission windows 71 are disposed in the formed packaging layer 70.

It should be noted that the manufacture method of the X-ray detection board is not limited to the specific method described in the above embodiment. The X-ray detection board may be made by any other method. The manufacture method may be different from that described in the above embodiment if a specific structure of the adopted thin film transistors 40 is different from that of the thin film transistors 40 described in the above embodiment. However, The manufacture method according to embodiments of the present invention includes these different methods.

According to embodiments of the present invention, there is provided an X-ray detection device comprising any of the abovementioned X-ray detection boards.

In the above embodiment, as illustrated in FIG. 1, when X-rays irradiate the detection board, they irradiate the conversion layer through the transmission windows 71 of the packaging layer 70 and are converted into visible light by the conversion layer 60, and then the visible light are projected on the photodiodes 20 through the condenser lenses 30 and are finally converted into electrical signals. A light condensing effect is improved through the condenser lenses such as microlenses so that more light can be projected upon the photodiodes 20 through the condenser lenses 30. As a result, a quantum efficiency is improved, thereby improving the imaging effect.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

The invention claimed is:

1. An X-ray detection board, comprising:
   a substrate;
   photoelectric conversion devices disposed on the substrate;
   a conversion layer disposed over the photoelectric conversion devices and configured to convert X-rays into visible light; and
   a packaging layer disposed on the conversion layer and having a plurality of transmission windows, wherein the photoelectric conversion devices correspond in position to the transmission windows, respectively, and wherein condenser lenses for condensing the visible light into which X-rays are converted by the conversion layer are disposed on sides of the photoelectric conversion devices facing the transmission windows.

2. The X-ray detection board of claim 1, wherein:
   the conversion layer comprises a scintillator layer or a fluorophor layer.

3. The X-ray detection board of claim 1, wherein:
   the condenser lenses comprise a plurality of convex lenses or triangular prisms arranged in an array manner.

4. The X-ray detection board of claim 1, further comprising:
   thin film transistors disposed on the substrate, the thin film transistors and the photoelectric conversion devices being arranged side by side and coupled to one another.

5. The X-ray detection board of claim 4, further comprising:
   a first reflection layer disposed between the conversion layer and the thin film transistors and configured to reflect light that otherwise would be irradiated onto the thin film transistors; and
   a second reflection layer disposed on the packaging layer and configured to cooperate with the first reflection layer.

6. The X-ray detection board of claim 5, wherein:
   the first reflection layer comprises a plurality of arc-shaped protrusions and a reflection film disposed on the arc-shaped protrusions, or
   the first reflection layer comprises a plurality of arc-shaped protrusions which form a reflection surface.

7. The X-ray detection board of claim 5, wherein:
   a projection of the second reflection layer on a plane in which the first reflection layer is located, in a direction perpendicular to the first reflection layer is partially superposed with the first reflection layer.

8. The X-ray detection board of claim 1, wherein:
   the photoelectric conversion devices comprise photodiodes or amorphous silicon layers.

9. A manufacturing method of the X-ray detection board according to claim 1, comprising steps of:
   forming the condenser lenses over the photoelectric conversion devices, respectively;
   forming the conversion layer over the formed condenser lenses;
   forming the packaging layer over the formed conversion layer; and
   forming the plurality of transmission windows in the formed packaging layer, wherein the photoelectric conversion devices correspond in position to the transmission windows, respectively.

10. The manufacturing method of claim 9, wherein:
    the photoelectric conversion devices comprise photodiodes or amorphous silicon layers.

11. The manufacture method of claim 9, wherein:
    the X-ray detection board further comprises thin film transistors disposed on the substrate, the thin film transistors and the photoelectric conversion devices being arranged side by side and coupled to one another.

12. The manufacturing method of claim 11, further comprising:
    forming a first reflection layer over the thin film transistors before the step of forming the condenser lenses on the formed photoelectric conversion devices, the first reflection layer being configured to reflect light that otherwise would be irradiated onto the thin film transistors; and forming a second reflection layer on the packaging layer when forming the packaging layer, the second reflection layer being configured to cooperate with the first reflection layer.

13. An X-ray detection device, comprising the X-ray detection board according to claim 1.

* * * * *